United States Patent [19]
Ramadoss et al.

[11] Patent Number: 5,831,437
[45] Date of Patent: Nov. 3, 1998

[54] TEST GENERATION USING SIGNAL FLOW GRAPHS

[75] Inventors: Rajesh Ramadoss, Piscataway; Michael L. Bushnell, East Windsor, both of N.J.

[73] Assignee: Rutgers University, Piscataway, N.J.

[21] Appl. No.: 582,365

[22] Filed: Jan. 5, 1996

[51] Int. Cl.$^6$ .................................................. G01R 31/02
[52] U.S. Cl. .......................... 324/537; 324/500; 364/553; 364/578
[58] Field of Search ..................................... 324/537, 500, 324/555, 76.11; 364/481, 553, 578

[56] References Cited

U.S. PATENT DOCUMENTS

| | | | |
|---|---|---|---|
| 4,242,751 | 12/1980 | Henckels et al. | 371/26 |
| 4,687,988 | 8/1987 | Eichelberger et al. | 324/73.1 |
| 5,640,403 | 6/1997 | Ishiyama et al. | 371/26 |
| 5,642,296 | 6/1997 | Saxena | 364/552 |

OTHER PUBLICATIONS

Balbanian et al. "Electrical Network Theory", John Wiley & Sons Inc., 1969, pp. 646–686.

N. Nagi et al. "Fault Simulation of Linear Analog Circuits" Journal of Electronic Testing, Nov. 1993, pp. 345–360.

P. Duhamel et al. "Automatic Test Generation Techniques For Analog Circuits and Systems: A Review", IEEE Trans. on Circuits and Systems Jul., 1979, pp. 411–440.

N. Nagi, et al. "Drafts: Discretized Analog Circuit Fault Simulator" 30th ACN/IEEE Design Automation Conf. pp. 509–514, 1993 (month unavailable).

A. Chatterjee "Concurrent Error Detection in Linear Analog and Switched Capacitor State Variable Systems Using Continuous Checksums", International Test Conf. 1991, pp. 582–591 (month unavailable).

A. Charoenrook et al., "Fault Diagnosis of Flash ADC Using DNL Test" International Test Conf., 1993 pp. 680–689 (month unavailable).

A.L. Rosenblum et al., "Multiparameter Sensitivity in Active RC Networks" IEEE Trans on Circuit Theory, Nov. 1971, pp. 592–599.

A. Meixner et al., "Fault Modeling For the Testing of Mixed Integrated Circuits" International Test Conf., 1991, pp. 564–572 (month unavailable).

G. Stenbakken et al. "Linear Error Modeling of Analog and Mixed–Signal Devices", Internatinal Test Conf. 1991, pp. 573–581 (month unavailable).

L. Milor et al. "Detection of Catastrophic Faults in Analog Integrated Circuits" IEEE Trans. on Computer–Aided Design, Feb. 1989, pp. 114–130.

*Primary Examiner*—Glenn W. Brown
*Attorney, Agent, or Firm*—Mathews, Collins, Shepherd & Gould, P.A.

[57] ABSTRACT

The present invention relates to a method and apparatus for generating test patterns to test an analog or mixed signal circuit. A signal flow graph of the analog circuit is determined. The signal flow graph is inverted and reverse simulated with good and bad outputs to determine component tolerances of the circuit given circuit output tolerances. The inverted signal flow graph is backtraced from analog outputs to obtain analog input sinusoids which justify the analog outputs.

13 Claims, 11 Drawing Sheets

TEST GENERATION USING SIGNAL FLOW GRAPHS

This invention was made with government support under Grant Number F33615-93C-4309 of the Defense Advanced Research Projects Agency. The Government has certain rights in this invention.

BACKGROUND OF THE INVENTION

1. Field of the Invention

This invention relates to a method of testing analog and mixed analog/digital circuits in which the analog circuit defined as a signal flow graph is backtraced in order to generate test waveforms which can be applied to the circuits to be tested.

2. Description of the Related Art

Mixed signal devices are being increasingly used for wireless communication, data acquisition and processing and other applications of analog and digital processing. The use of analog components within digital systems has necessitated testing of analog circuits to determine faults of the circuit. Advances in test generation for analog and mixed signal devices have not kept up with the comparable digital testing, which uses the stuck at fault model, because of the complex nature of the analog circuits. Accordingly, it has become a problem in the industry to test analog and mixed signal devices having analog and digital circuits.

Conventional solutions to testing of analog and mixed signal devices have been achieved by sensitivity analysis of models of the devices to be tested. Analog fault models of "catastrophic" faults on which there is a sudden and large deviation in a component value resulting in shorted and open circuits and "parametric" faults in which a component value varies with time or environment, causing potentially unacceptable deviations in the circuit behaviors have been described in Duhamel et al, *Automatic Test Generation Techniques for Analog Circuits and Systems: A Review*, IEEE Transactions on Circuits and Systems, Vol. CAS-26, No. 7: 411–440 July 1979. Analog test methods described include estimation methods, topological methods, taxonomical methods and linear system methods.

An approach for detection of catastrophic faults in analog integrated circuits uses polytype modeling as described in Milor et al. *Detection of Catastrophic Faults In Analog Integrated Circuits*, IEEE Transactions on Computer Aided Design, Vol. 8, No. 2: 114–130, Februrary 1989. Another approach for modeling of analog and mixed signal devices uses linear error modeling as described in Stenbakken et al *Linear Error Modeling of Analog and Mixed Signal Devices*, In Proceedings of International Test Conference, pp. 573–581, 1991. The model serves the purpose of parameterizing the device response in terms of a set of error parameters and provides the capability of predicting the response for any test condition. The linear model is complete for a given device and candidate test space. The above-described models have the drawback that there is no guarantee that the models will be efficient. The drawback of these methods is that they do not define the exact analog component variations (the parametric faults) that cause a circuit malfunction.

A fault modeling technique for simulating defective analog components in mixed analog digital integrated circuits is described in Meixner et al. *Fault Modeling For The Testing of Mixed Integrated Circuits*, International Test Conference, 1991. In a first step, defect simulation is performed to find the circuit faults that are likely to occur in actual integrated circuits. A second step forms the fault model by mapping circuit behaviors into the model to simulate such behaviors. A third step verifies the fault model in which a complete and detailed description of the defective circuit and the fault model are compared via simulation. If the quantative comparison of the simulation is too large, the fault model is modified by repeating steps 2 and 3 until the model performs satisfactorily. The above described modeling approach has the shortcomings of having limited efficiency and limited fault modeling. This technique can only model short circuits, open circuits, and parametric coupling of wires. It cannot model component parameter variations.

An analog circuit efficient fault simulation for mapping the circuit and circuit level faults to the discrete domain is described in Nagi et al. *Discretized Analog Fault Simulator* ACM/IEEE Design Automation Conference, pp. 592–599, June, 1993. Bilinear transformations map circuit equations into the Z domain. A first module performs a good circuit simulation while a second module processes the fault list and maps each fault into the discrete domain. A circuit description is given as input to a simulator. The simulator can use a simulation package, such as the simulation package with integrated circuit emphasis, SPICE, format. A preprocessor parses the input to extract connectivity information into an internal graph data structure. A transfer function is determined for each operational amplifier (op amp) block of the circuit. A signal flow graph is constructed and the transfer functions are used to obtain appropriate weights on the edges of the signal flow graph. Since the obtained signal flow graph may not be in the form that directly results in state equations, because the state equations are first order differential equations while the transfer functions can be second or higher order, the op amp faults are first modeled in the S-domain before mapping them to the Z-domain. The resulting equations are simulated for any given input. The above-described simulation approach has the drawback of defining the effect of the fault on the circuit outputs, but not defining the analog test pattern needed to test the circuit.

It is desirable to provide a simplified method for test generation and fault deformation of analog and mixed signal devices.

SUMMARY OF THE INVENTION

Briefly described, the present invention relates to a method and apparatus for testing analog and mixed analog and digital circuits in which test waveforms are generated by backtracing the analog circuit. The analog circuit can be represented by a signal flow graph. The signal flow graph is inverted to describe analog inputs to the circuit in terms of analog outputs. A circuit not having any modeled faults is defined as a "good" circuit and a circuit having one or more modeled analog faults is defined as a "bad circuit". A good output represents output which is within the output voltage tolerance and a bad output represents an output which is outside the output voltage tolerance. In the analog circuit embodiment, tolerances of analog components can be defined in terms of the analog circuit output deviations with good and bad outputs of the circuit. Analog input test waveforms are obtained by backtracing the inverted signal flow graph with reverse analog simulation. The generated input test waveforms can be applied to the analog circuit for testing the circuit.

In a mixed circuit embodiment, analog outputs can drive the digital circuit through an analog to digital converter. The interconnections of the digital circuit are described to determine digital inputs for testing a digital fault in the circuit.

The input of the digital circuit can be an output analog voltage which is traced backwards through the analog to digital converter to determine the voltage needed on the analog circuit to excite the digital fault. A tolerance of the output voltage can be used to obtain a percent deviation of the analog components that will cause a change in the analog output. The output voltage and tolerance can be backtraced with reverse analog simulation through an inverted signal flow graph of the analog circuit to obtain input sinusoid waveforms which can be applied to the circuit under test. The method of the present invention can also be used for digital circuits that have a digital input applied to an analog circuit through a digital to analog converter. The present invention has the advantage of expeditiously and accurately testing analog and mixed signal circuits and precisely defines the parametric fault model for each analog circuit component in terms of what the digital circuit can actually observe. The method can be easily integrated with digital test generators. The method can be used on industrial mixed signal circuits such as those used in wireless telephony.

The invention will now be more fully described by reference to the following drawings.

DETAILED DESCRIPTION OF THE PREFERRED EMBODIMENT

During the course of this description like numbers will be used to identify like elements according to the different figures which illustrate the invention.

Figure 1:
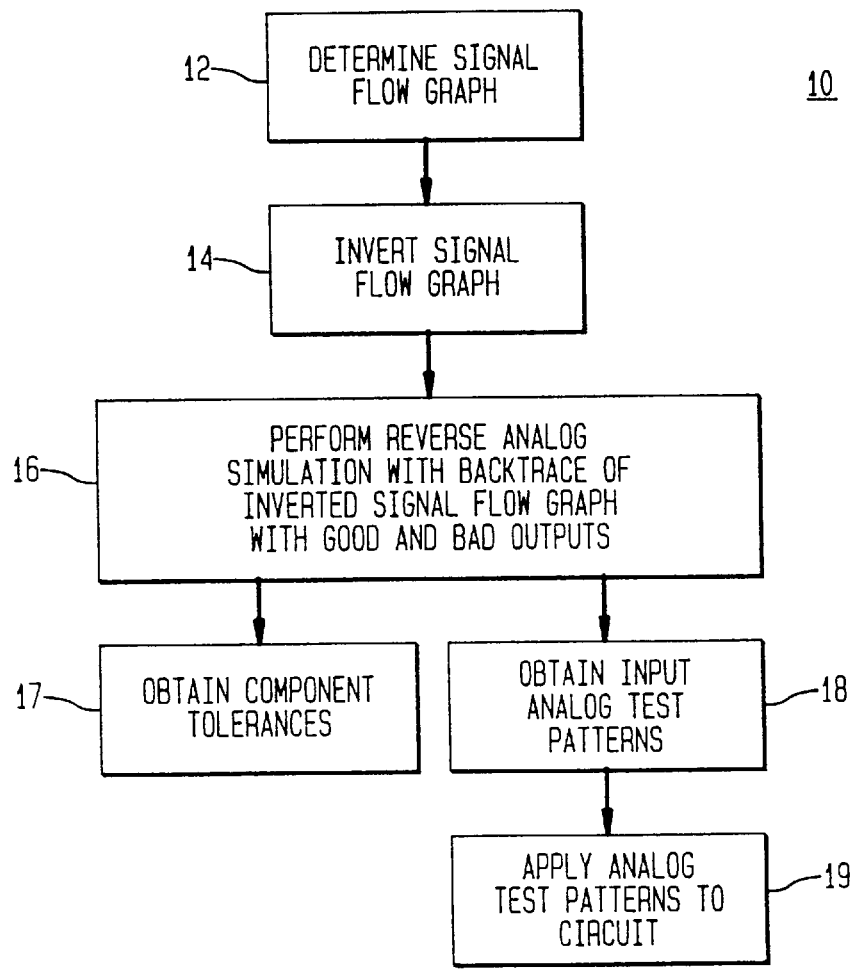
FIG. 1 is a flow diagram of the method for testing an analog circuit in accordance with the principles of the present invention.

FIG. 1 is a flow diagram illustrating the basic concept of a method for testing an analog circuit 10 in accordance with the principles of the present invention. Module 12 determines a signal flow graph of an analog circuit to be tested. The signal flow graph can be defined as a set of equations relating circuit state variables, inputs and outputs of a circuit in graph form. The signal flow graph is inverted in module 14 to enable a backtrace of the analog circuit from analog outputs to analog inputs and to generate analog input sinusoids that justify the analog outputs. Module 16 performs reverse analog simulation of the inverted signal flow graph. The inverted signal flow graph is simulated with predetermined output to find the original analog input that will justify the analog outputs. Signal flow graph inversion is described by Balbanian et al. *Electrical Network Theory*, pp. 646–686, John Wiley & Sons Inc., 1969, hereby incorporated by reference into this application. A range of values of output voltages for the analog circuit are used in the reverse simulation to obtain component tolerances in module 17 and to obtain input analog test patterns in module 18 which will be described in more detail below. An output voltage tolerance $\Delta V$ of the analog circuit can be user-specified. A fault of a component of the analog circuit is determined when at least one of the analog outputs is greater than the output voltage tolerance $\Delta V$. The input analog test patterns can be applied to the analog circuit in module 19 for testing the analog circuit.

Figure 2:
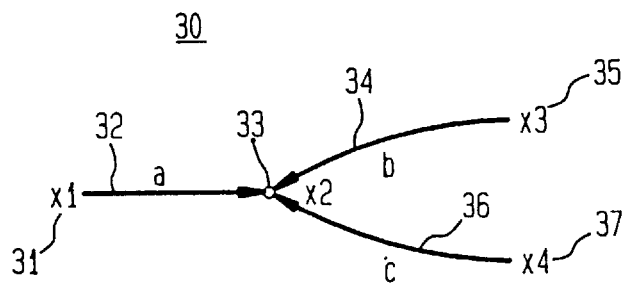
FIG. 2 is a signal flow graph of an analog circuit.
Figure 3:
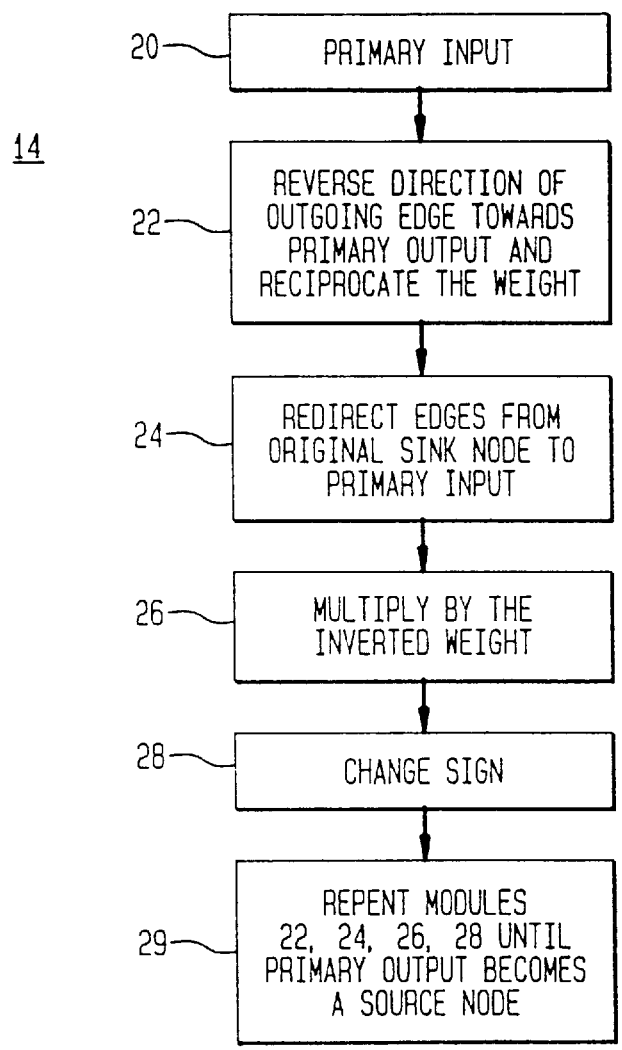
FIG. 3. is a flow diagram of the method for inversion of the signal flow graph.
Figure 4:
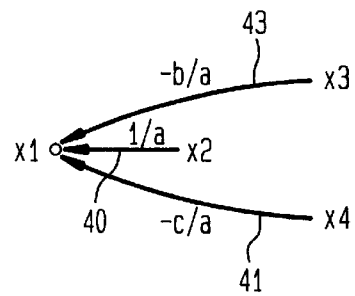
FIG. 4 is an inverted signal flow graph of the signal flow graph shown in FIG. 2.

FIGS. 2–4 illustrate signal flow graphs of the analog circuit. FIG. 2 represents a signal flow graph 30 which is a graph of an analog circuit having the following equation:

$$x2 = a \cdot x1 + b \cdot x3 + c \cdot x4 \quad (1)$$

Primary input x1 31 is connected to primary output x2 33 along edge 32. Edge 32 is weighted by constant a. Input x3 35 is connected along edge 34 and input x4 37 is connected along edge 36 to primary output x2 33. Edge 34 is weighted with constant b and edge 36 is weighted with constant c.

The signal flow graph can be inverted as shown in the following equation:

$$x1 = \frac{1}{a} x2 - \frac{b}{a} x3 - \frac{c}{a} x4 \quad (2)$$

FIG. 3 is a flow diagram for the inversion of the signal flow graph. A primary input module 20 receives the primary input such as primary input x1 31. Module 22 reverses the outgoing edge of primary output x2 33 to primary input x1 31 in module 22. Module 24 redirects all edges incident on the primary output x2 33 to the primary input x1 31. Module 26 inverts the original weights on paths between the primary inputs and primary outputs and module 28 changes the sign of the weighted paths. Edge 40 between the primary output x2 33 and primary input x1 31 is weighted by 1/a which is the reciprocal of the original weight. In this case primary input x1 31 becomes a sink node having incoming edges only and no outgoing edges. The original weights on edges 41 and 43 are multiplied by the weight 1/a and the sign is reversed. This sign is reversed because the change of the direction of the edge in the signal flow graph corresponds to moving the term to the opposite side of the corresponding equation. Module 29 repeats modules 22, 24, 26 and 28 until the primary output becomes a source node. FIG. 4 is the resulting signal flow graph of Eq. 2 after inversion of the signal flow graph shown in FIG. 2.

Figure 5:
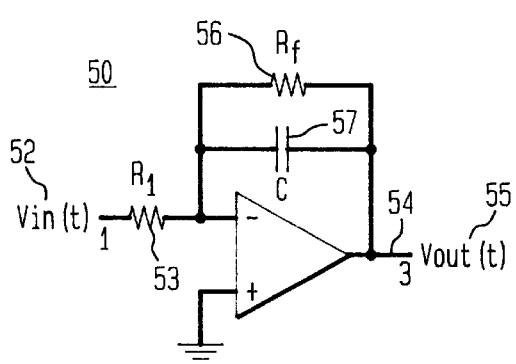
FIG. 5 is a schematic diagram of an integrator circuit.

FIGS. 5 through 8 illustrate signal flow graph inversion for an integrator circuit. FIG. 5 shows integrator circuit 50. Voltage Vin (+) 52 is applied at node 1. Resistance $R_1$ 53 is connected between nodes 1 and 4 and resistance $R_f$ 56 is connected between nodes 4 and 3. Node 2 is a dummy node used to avoid a self loop on output node 3. An edge having the variable "s" in its edge expression indicates that the edge weight varies with the "s" variable. Voltage output Vout(t) 55 corresponds to integrator circuit 50 output 54 at node 3.

Figure 5A:
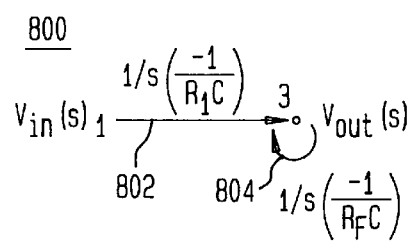
FIG. 5A is a signal flow graph of the integrator circuit shown in FIG. 5 including a self loop of an output node.

FIG. 5A illustrates a signal flow graph 800, EDGE 802 between node 1 and node 3 has a weight of $$\frac{1}{s}\left(\frac{-1}{R_1 C}\right).$$

Edge 804 for a self loop on node 3 has an edge weight of $$\frac{1}{s}\left(\frac{-1}{R_f C}\right).$$

Figure 6:
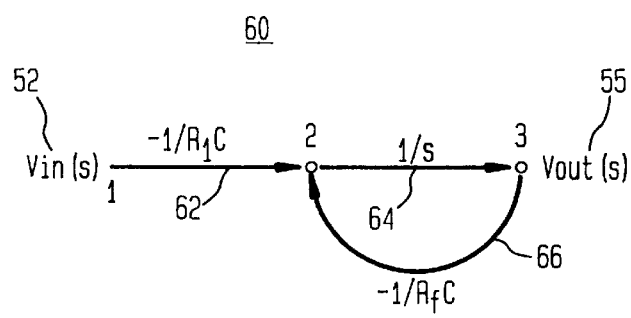
FIG. 6. is a signal flow graph of the integrator circuit shown in FIG. 5A to avoid the self loop of the output node.
Figure 7:
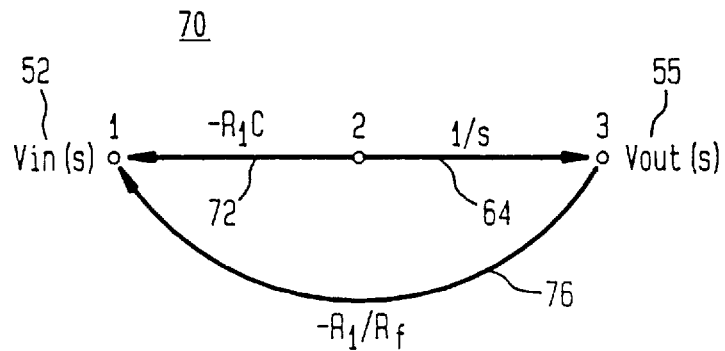
FIG. 7 is an intermediate signal flow graph of the integrator circuit graphed in FIG. 6.
Figure 8:
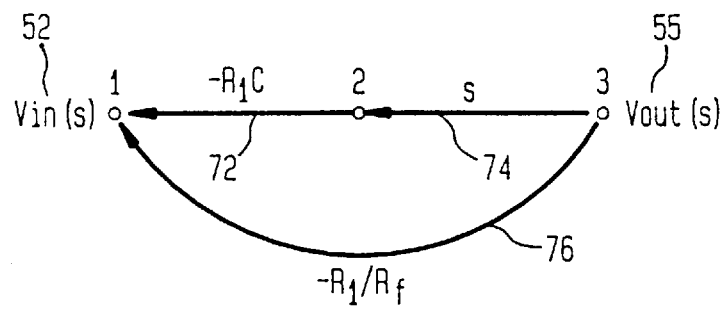
FIG. 8 is an inverted signal flow graph of the signal flow graph shown in FIG. 6.

FIG. 6 illustrates a signal flow graph 60 of integrator circuit 50. Edge 62 between node 1 and node 2 has a weight of $-1/R_1 C$. Edge 64 between node 2 and node 3 has weight 1/s coming from feedback capacitor C 57 in integrator circuit 50. Edge 66 between node 3 and node 2 has a weight of $-1/R_f C$. After applying modules 20, 22 and 24 shown in FIG. 3, an intermediate inverted signal flow graph 70 is represented in FIG. 7. Edge 72 between node 2 and node 1 has been reversed and a new weight of $-R_1 C$ is applied. Edge 76 from output node 3 is redirected to input node 1 and a new weight of $-(R_1 Cx\ 1/R_f C) = -R_1/R_f$ is applied. The intermediate edge 64 between node 2 and node 3 is inverted as edge 74 and its weight is as shown in FIG. 8. In FIG. 8, the output Vout(s) 55 has become a source node and the input Vin(s) a sink node to provide a feedforward network of the signal flow graph shown in FIG. 6. The value of any node in the signal flow graph corresponds to the magnitude or phase of the physical voltage, current, or other parameter associated with the corresponding analog circuit node. The parent value of an edge is the value of the signal flow graph node at the tail of the edge. This signal flow graph node represents the magnitude or phase of the physical circuit parameter associated with the parent node. The edge weight is the symbolic expression for the edge. The value of any signal flow graph node is represented by the following equation.

$$\text{value}(i) = \Sigma(\text{parentvalue}) \cdot (\text{edgeweight}) \quad (3)$$

The inverted signal flow graph can be simulated with predetermined output to obtain network input values. The s operator in the Laplace domain corresponds to differentiation in the time domain. A set of output samples are used in Eq. 3 to find the values at all nodes of the circuit. The inverted graph weights are all either numerical scalars, s, which corresponds to the differential operator and can be numerically approximated, or 1/s, which corresponds to the integration operator and can be numerically approximated. The input corresponding to a given output is determined subject to the constraint that nonlinear networks can be reverse simulated to find one of the many possible input sets that produce a given output.

Output samples for a given circuit, such as above described integrator circuit 50 can be reverse simulated by the simulation package with integrated circuit emphasis SPICE. The following equations represent second order approximations of sinusoidal input waveforms.

$$\Delta f(x_i) = f(x_{i+1}) - f(x_i) \quad (4)$$

$$\Delta^2 f(x_i) = f(x_{i+2}) - 2f(x_{i+1}) + f(x_i) \quad (5)$$

$$f(x_{i+1}) = \frac{1}{\Delta t}\left(\Delta + \frac{\Delta^2}{2}\right) f(x_i) \quad (6)$$

$$f'(x_i) = \frac{1}{\Delta t}\left(\Delta - \frac{\Delta^2}{2}\right) f(x_i) \quad (7)$$

where $f(x_i)$ is a set of samples of the waveform.

Figure 9:
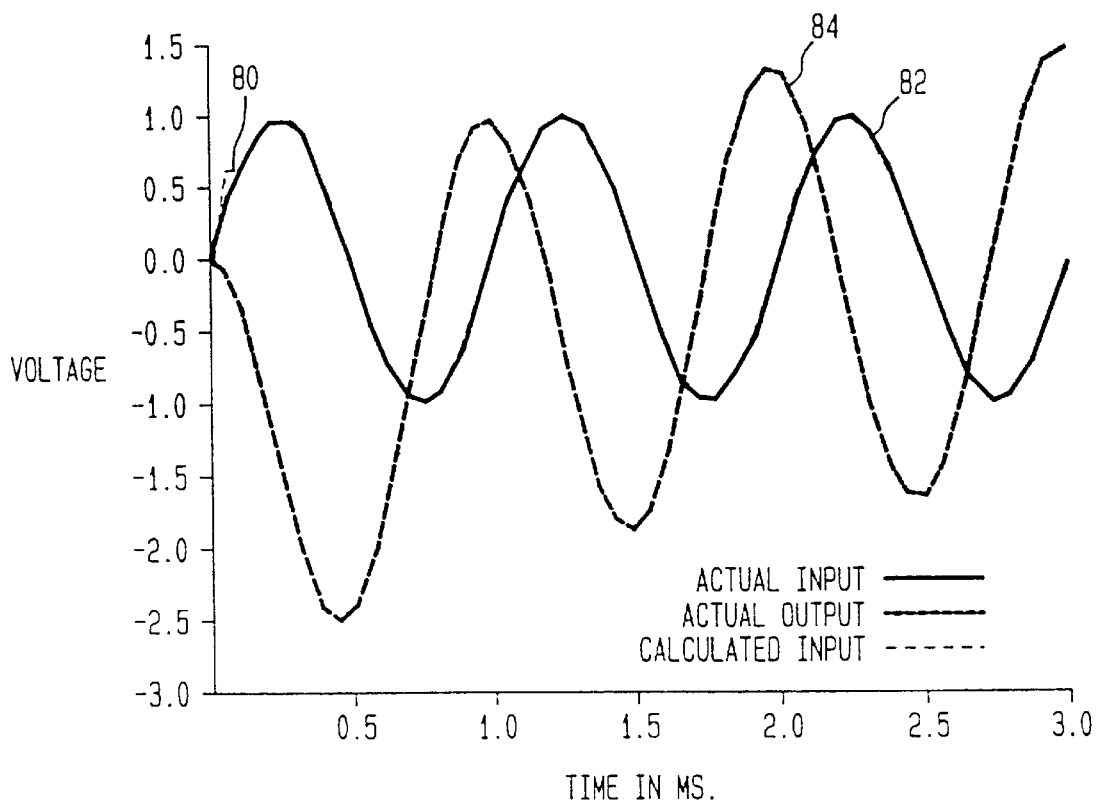
FIG. 9 is a graph of a comparison of calculated input waveforms of the present invention results with actual circuit results.

FIG. 9 is a graph of a comparison of calculated input waveform 80 from the method of the present invention to actual input 82 and actual output 84 for the integrator circuit 50. The calculated input waveform 80 was generated with SPICE inputs and equations 4–7 with nominal values $R_f = 100 K\Omega$, $R_i = 10 K\Omega$ and $C = 0.01\ \mu F$. From FIG. 9 it is shown that calculated input waveform 80 follows the actual input waveform 82 very closely with the minor initial error due to a lack of negative indexed values.

Figure 10:
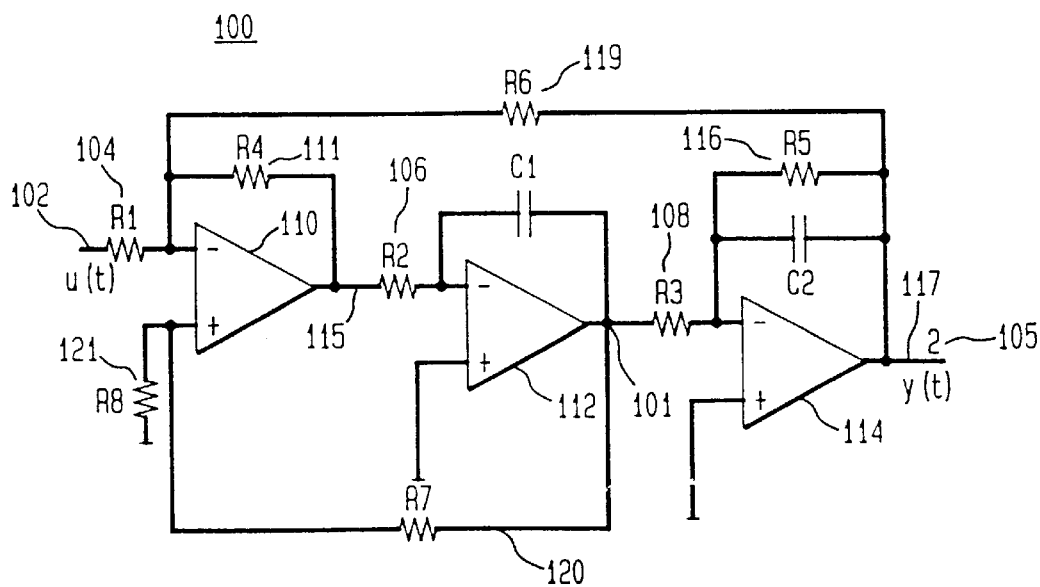
FIG. 10 is a schematic diagram of a biquadratic filter circuit.

FIG. 10 is a schematic diagram of a biquadratic filter circuit 100 having input u(t) 102 and output y(t) 105. Resistors $R_1$ 104, $R_2$ 106 and $R_3$ 108 are connected to respective op amp circuits 110, 112 and 114. Resistance $R_4$ 111 is connected to the output 115 of op amp circuit 110. Resistance $R_5$ 116 and resistance $R_6$ 119 are connected to output 117 of op amp circuit 114. Resistance $R_7$ 120 is connected to output 101 of op amp circuit 1 12. Resistance $R_8$ 121 is connected to op amp circuit 110.

Figure 11:
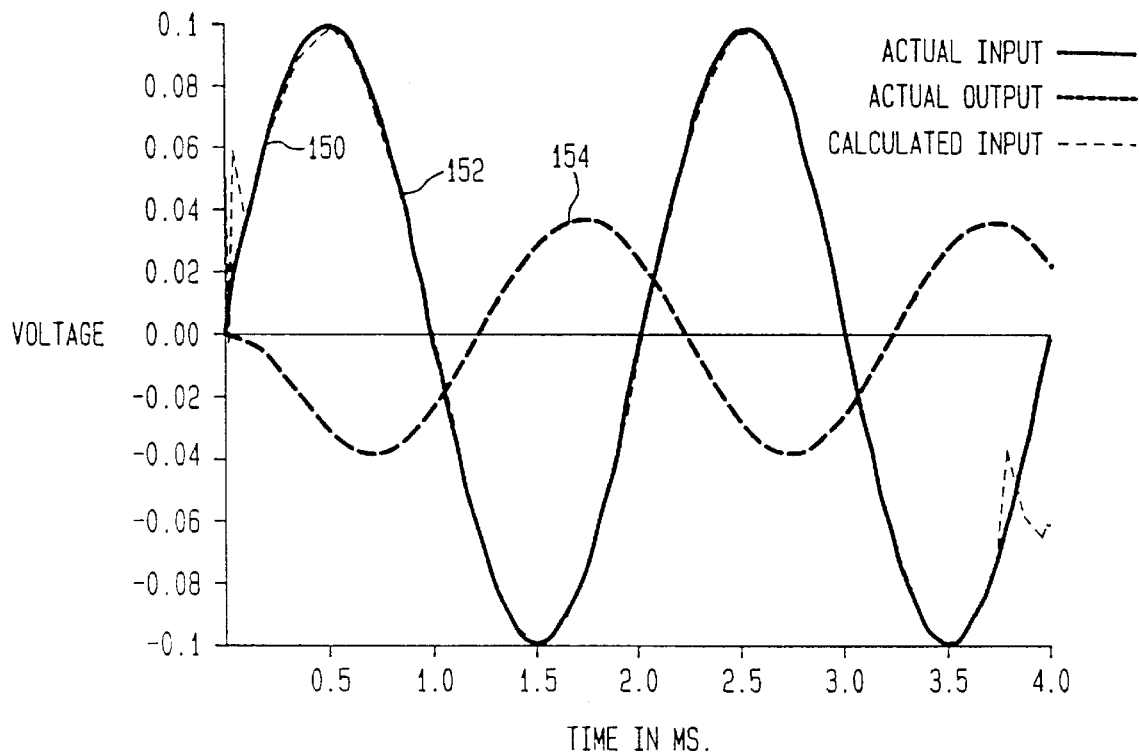
FIG. 11 is a graph of a comparison of calculated input waveforms of the present invention with actual circuit results of the biquadratic filter shown in FIG. 10.

FIG. 11 illustrates results of the biquadratic filter circuit 100 after applying the steps of the flow diagram of FIG. 1 with $R = 10 K\Omega$ and $C = 0.01\ \mu F$. The graph illustrates calculated input 150 which matches actual input 152 and is derived from calculated output 154. Calculated output 154 is a smooth regular waveform.

It has been found that the stability of the inverted signal flow graph can be improved since there are two sources of error in numerical approximation to differentiation/integration. Truncation error is caused by the dropping of high-order terms from the approximation formula used. Third-order and higher terms in the numerical differentiation formula of the present invention are dropped, and most numerical approximations are fourth-order or less. Round-off error is caused by finite-precision computer arithmetic. Round-off error is approximately $10^{-19}$ per operation using 64 bits of precision, so the smaller the operands, the greater the round-off error.

Numerical differentiation and integration differ substantially in their responses to truncation and round-off error. Numerical integration exhibits stability. As the step size $h_i$ is decreased, the total error stays constant, since numerical integration formulae rely on multiplications by the step size $h_i$ which is a very small number. However, numerical differentiation formulae rely on division by h ($\Delta t$). Hence, if the step size $h_i$ is decreased, truncation error is decreased, but round-off error is increased. Numerical differentiation formulae require empirical observation and correction of h to maintain stability.

Stability can be assured during simulation by considering an analog system with transfer function H(s) which can be written in the form:

$$H(s) = \frac{a_0 + a_1 s + a_2 s^2 + \ldots + a_n s^n}{b_0 + b_1 s + b_2 s^2 + \ldots + b_m s^m} = \frac{Y(s)}{X(s)} \quad (8)$$

with m>n. Y(s) is the circuit output and X(s) is the circuit input. Since the 1/s operator corresponds to integration, the analog system represented by H(s) integrates; the inverted signal flow graph is the network function of a system and performs the differential operation and can be unstable.

The reverse simulation of the present invention can be restricted using the following techniques for improving stability. Using numerical differentiation, which is accurate for smooth inputs and regular signals such as sinusoids and monotonic (exponential) signals. Not using numerical differentiation on random signals. Using a numerical approximation for the 1/s operator, which is integration. Increasing the sampling frequency while reducing round-off error. These techniques allow the method to converge to the correct analog input waveform for the test.

Figure 12:
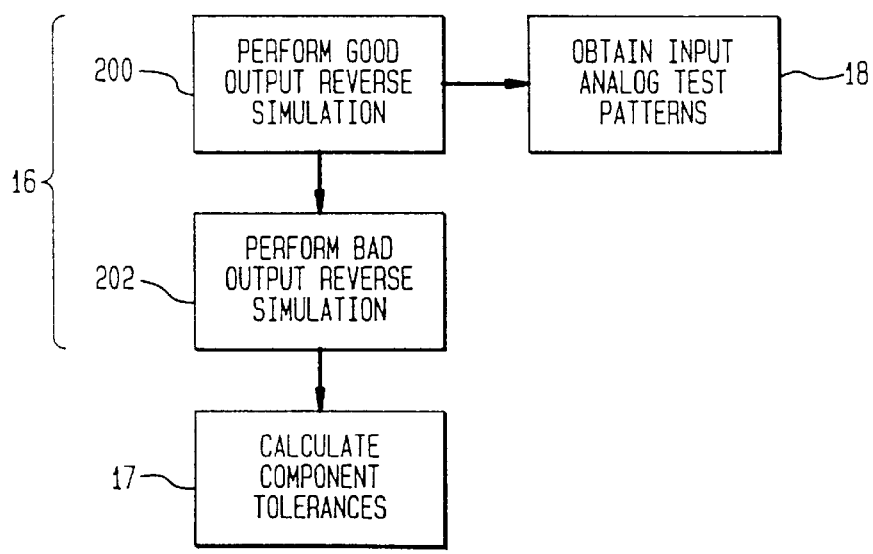
FIG. 12 is a flow diagram of the method for generation of test patterns.

FIG. 12 is a flow diagram of steps used for generating analog test patterns in module 18 of the method of the present invention. Using an assumed circuit output voltage tolerance, the signal flow graph is determined in module 12 (as shown in FIG. 1) and the edge weights of the graph are stored in numerical and symbolic form. A good output represents an output which is within the output voltage tolerance and a bad output represents an output which is outside the output voltage tolerance. The signal flow graph is inverted in module 14 and the edge weights are numerically stored. Good output reverse simulation is performed in block 200 for determining the values of all nodes of the circuit including the primary input node. Bad output reverse simulation is performed in block 202 for determining all node values. The good output values are used to obtain input analog test patterns in module 18 and both good and bad node values are used to calculate analog component tolerances in module 17.

From the original and inverted signal flow graphs, for example as shown in FIGS. 6 and 8, analog circuit component tolerances are symbolically determined to establish the analog circuit component tolerance that must be enforced to guarantee that the output analog circuit waveform falls within the tolerance, specified by the circuit designer.

The following steps can be used to establish component tolerances as referred to in FIGS. 1 and 12:

1. a first analog backtrace is performed of an inverted signal flow graph using good analog output values to obtain good signal values at all nodes in the signal flow graph and the analog input test waveform;
2. a second analog backtrace is performed on the inverted signal flow graph using bad analog output values to obtain the bad signal values at all nodes in the signal flow graph including the analog inputs;
3. in the original signal flow graph, before inversion of the signal flow graph, symbolic edge expressions are identified that include the faulty component parameter thereby establishing faulty edges;
4. for the nodes pointed to by the original signal flow graph edges, use the bad signal flow graph node values in an edge expression;
5. for the nodes from which these original signal flow graph edges emerge, use the good signal flow graph node values in the edge expression;
6. determine symbolic equations for the edges using the node values determined in step 4. For integrator circuit 50 and the original signal flow graph of FIG. 6, the faulty value of $R_1$ can be determined by:

$$\frac{\text{goodvalue}(1)}{-R_1 C} + \frac{\text{badvalue}(3)}{-R_f C} = \text{badvalue}(2) \tag{9}$$

In integrator circuit 50, node 1 has a good signal and node 3 has a bad signal. The fault on $R_1$ propagates to node 3.

Component deviations of multiple input/output circuits, as shown in FIG. 2, can be determined with the above described reverse simulation method 10. These linear analog circuits can be represented by the following set of equations:

$$X(t) = A \cdot X(t) + B \cdot U(t) \tag{10}$$

$$Y(t) = C \cdot X(t) + D \cdot U(t) \tag{11}$$

where X, U and Y are circuit state variables, inputs and outputs and A, B, C and D are matrices that depend on the circuit topology. The method 10 of the present invention is performed on each path from inputs to outputs of the circuit.

Non-linear analog circuit blocks, for example comparators and multipliers, cannot be represented by signal flow graphs. Analog backtrace can be used for nonlinear circuits by setting all but one input block constant at a predetermined noncontrolling value. An input with good and bad values is selected and an analog backtrace on the path towards the primary inputs is performed. At the end of the backtrace another input is selected and a backtrace is performed towards the primary inputs.

Figure 13:
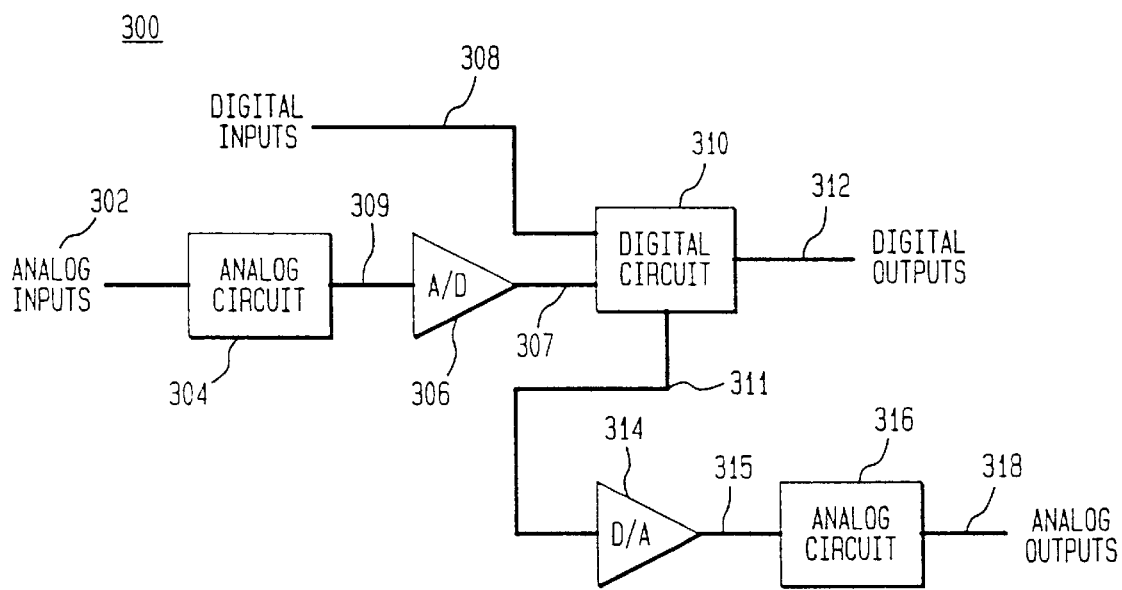
FIG. 13 is a schematic diagram of a mixed signal device having analog and digital circuits.

FIG. 13 illustrates an embodiment of mixed signal circuits 300. Analog inputs 302 are received at analog circuits 304. An analog to digital conversion is performed in block 306 to form digital circuit inputs 307 to digital circuit 310. Digital circuit 310 also receives digital input 308. Digital outputs 311 and 312 are outputted from digital circuit 310. Digital output 311 is received at digital to analog converter 314 for providing analog input 315 to analog circuit 316. Analog circuit 316 has analog outputs 318. In this embodiment, digital circuit 310 is driven by analog circuit outputs 309. The signal flow graph of the analog circuit 304 of the mixed signal circuit is determined in module 12.

Figure 14:
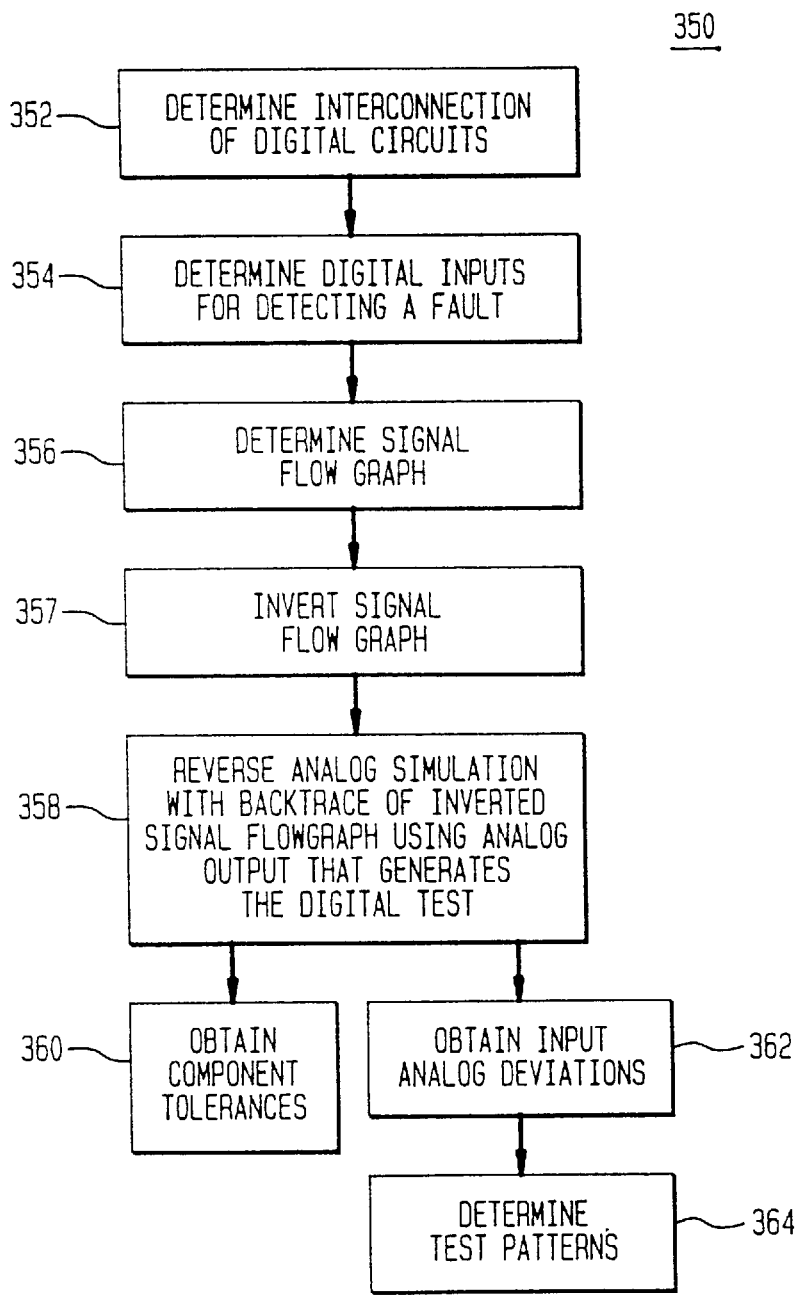
FIG. 14 is a flow diagram of the method for obtaining test patterns of a mixed circuit device.

FIG. 14 is a flow diagram of a method for testing a mixed signal circuit having analog and digital circuitry 350. The digital portion of the mixed signal circuit is determined in module 352 as the interconnection of logic gates and wires of the digital circuit. Module 354 determines digital inputs for detecting a fault and propagating input signal error through the digital circuit. A digital test generation algorithm can be used for determining the digital inputs for detecting a fault. An example of a test generation algorithm is the Path-Oriented Decision Method, PODEM, described by P. Goel *An Implicit Enumeration Algorithm To Generate Tests For Combinational Logic Circuits*, IEEE Trans. on Comp., C-30(3):215–222, March, 1981, herein incorporated by reference into this application. A determination of the needed voltage change on the analog outputs 309 to cause a change in the digital inputs is determined with the reverse analog simulation module in modules 356–364. A signal flow graph is determined for analog circuit 304 in module 356. In module 357, the signal flow graph of analog circuit 304 is inverted and module 358 performs reverse analog simulation to determine the analog sinusoidal waveform needed at analog inputs 302 to change the digital circuit output 312. The test waveforms can be applied to mixed signal circuit 300 for testing the circuit. An output voltage tolerance $\Delta V$ for output voltage V of mixed circuit 300 can be determined from the precision of the analog to digital converter 306 since the precision of $\Delta V$ is typically determined to be the same or less than the precision of analog to digital converter 306. Alternatively voltage tolerance $\Delta V$ can be user specified. Voltage V and voltage tolerance $\Delta V$ are backtraced in the analog circuit.

During the backtrace of analog circuit 304 in module 360, analog component percentage deviations for changing digital outputs 312 are determined in module 362 which can be determined by good and bad outputs as described above and the test patterns for obtaining changes in the digital circuit 310 are determined in block 364. The percentage deviations define parametric faults of the analog components.

Figure 15:
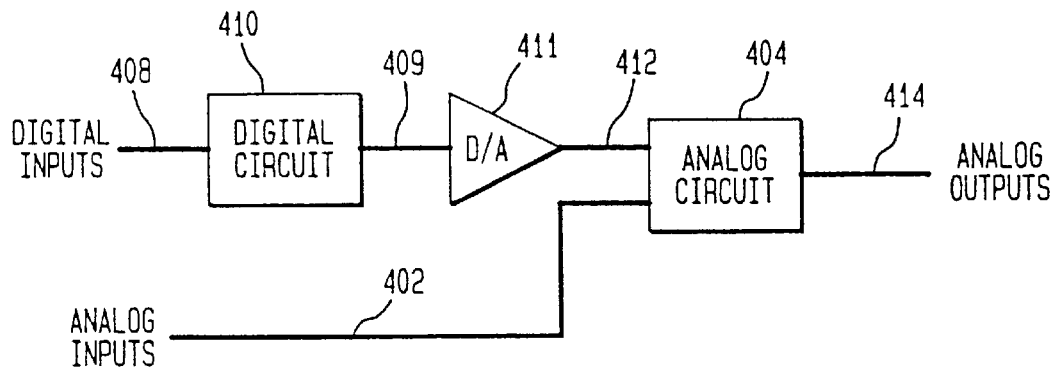
FIG. 15 is a schematic diagram of an alternate embodiment of a mixed circuit device.

FIG. 15 illustrates an alternative embodiment of a mixed signal circuit 400. Analog inputs 402 are applied to analog circuit 404. Digital inputs 408 are received at digital circuit 410 and digital output 409 is received at digital to analog converter 411. Analog input 412 from digital to analog converter 411 is applied to analog circuit 404. Analog outputs 414 are outputted from analog circuit 404. In this embodiment, a signal flow diagram is determined for analog circuit 404. Digital input values are determined to detect a digital fault in digital circuit 410. Analog input voltage is determined from digital output 409. A forward analog simulation to propagate the digital fault through analog circuit 404 is performed. A backtrace with reverse analog simulation is performed with the method of the present invention 10 for determining analog component parametric variations by using analog output voltage V and voltage tolerance $\Delta V$ to determine analog inputs 402 required for analog output 414. The digital to analog converter 411 defines the voltage tolerance $\Delta V$ of the analog circuit output voltage V, since the precision of $\Delta V$ is typically determined to be the same or less than the precision of the output of the digital to analog converter. Alternatively, $\Delta V$ can be user specified. The analog input is backtraced through the digital to analog converter 411 to determine the digital outputs. The digital inputs necessary to test analog circuit 404 can be determined by automatic test generation.

Figure 16:
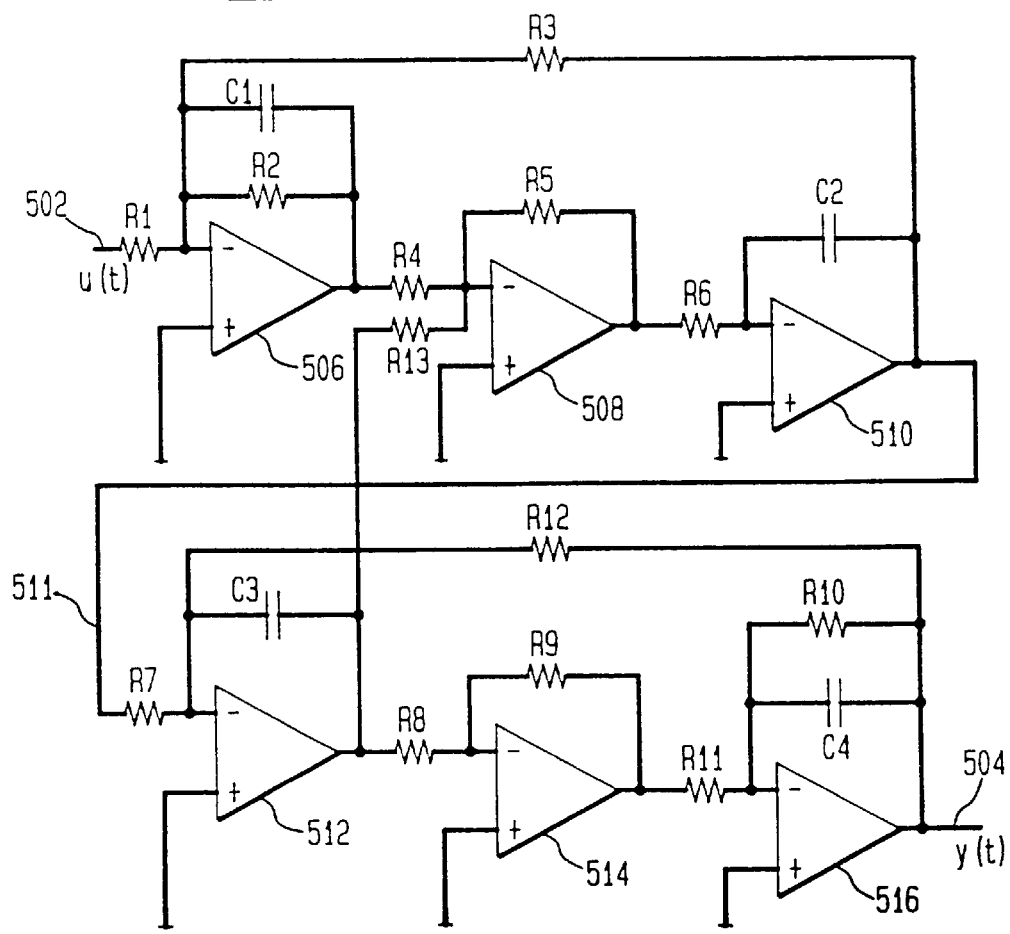
FIG. 16 is a schematic diagram for an analog leapfrog filter circuit.
Figure 17:
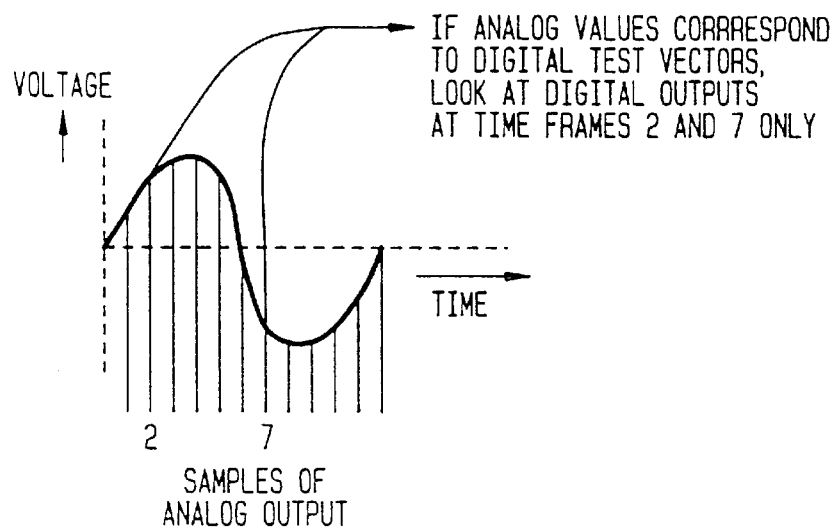
FIG. 17 is a graph of a mixed signal test.

Leapfrog circuit 500 is illustrated in FIG. 16. Input u(t) 502 is applied to leapfrog circuit 500 resulting in output y(t) 504. Output 511 from a plurality of serial op amp circuits 506, 508, 510 is applied to serial op amp circuits 512, 514 and 516.

Table 1 shows the results for the analog backtracing biquad filter 100 shown in FIG. 10 and leapfrog circuit 500 shown in FIG. 16. An output voltage increase is 10% and nominal values are R=10K$\Omega$ for both filters and C=0.02 $\mu$F for the biquadratic filter and 0.01 $\mu$F for the leapfrog filter. The circuits are passed in a SPICE format with a modification that primary inputs, resistors, capacitors, primary outputs and op amps are treated as primitives. Node voltages are used and the signal flow graph is calculated. The signal flow graph is inverted and good and bad values are calculated at all nodes. An equation similar to Equation 9 is determined for each component in the circuit. The equation is linear in one value and can be solved by MATLAB, a symbolic mathematical equation solving program, defined in MATLAB's User's Guide, The Math Works Inc., 1992.

TABLE 1

| | Biquad Filter | | Leapfrog Filter | |
|---|---|---|---|---|
| Comp. | Allowed Value | Deviation | Allowed Value | Deviation |
| $R_1$ | 8.82 K$\Omega$ | 11.8% | 9.09 K$\Omega$ | 9.1% |
| $R_2$ | 9.09 K$\Omega$ | 9.1% | 11.98 K$\Omega$ | 19.8% |
| $R_3$ | 9.09 K$\Omega$ | 9.1% | 12.6 K$\Omega$ | 26.0% |
| $R_4$ | 15.36 K$\Omega$ | 53.6% | 9.09 K$\Omega$ | 9.1% |
| $R_5$ | 11.67 K$\Omega$ | 16.7% | 39.96 K$\Omega$ | 299.6% |
| $R_6$ | 12.15 K$\Omega$ | 21.5% | 9.095 K$\Omega$ | 9.1% |
| $R_7$ | 13.09 K$\Omega$ | 30.9% | 9.09 K$\Omega$ | 9.1% |
| $R_8$ | 7.64 K$\Omega$ | 23.6% | 9.09 K$\Omega$ | 9.1% |
| $R_9$ | — | — | 11.00 K$\Omega$ | 10.0% |
| $R_{10}$ | — | — | 11.32 K$\Omega$ | 13.2% |
| $R_{11}$ | — | — | 9.09 K$\Omega$ | 9.1% |
| $R_{12}$ | — | — | 11.19 K$\Omega$ | 11.9% |

TABLE 1-continued

| | Biquad Filter | | Leapfrog Filter | |
|---|---|---|---|---|
| Comp. | Allowed Value | Deviation | Allowed Value | Deviation |
| $R_{13}$ | — | — | 11.15 K$\Omega$ | 11.5% |
| $C_1$ | 0.0182 $\mu$F | 9.0% | 0.0001 pF | 99.9% |
| $C_2$ | 0.0150 $\mu$F | 25.0% | 0.0091 $\mu$F | 9.0% |
| $C_3$ | — | — | 0.0038 $\mu$F | 62.0% |
| $C_4$ | — | — | 0.0059 $\mu$F | 41.0% |

Table 2 shows the results for filter deviations of a mixed signal circuit for biquad and leapfrog filters.

TABLE 2

| | Biquad Filter | | Leapfrog Filter | |
|---|---|---|---|---|
| Comp. | Allowed Value | Deviation | Allowed Value | Deviation |
| $R_1$ | 9.80 K$\Omega$ | 2.0% | 9.84 K$\Omega$ | 1.6% |
| $R_2$ | 9.84 K$\Omega$ | 1.6% | 10.29 K$\Omega$ | 2.9% |
| $R_3$ | 9.84 K$\Omega$ | 1.6% | 10.36 K$\Omega$ | 3.6% |
| $R_4$ | 10.64 K$\Omega$ | 6.4% | 9.84 K$\Omega$ | 1.6% |
| $R_5$ | 10.25 K$\Omega$ | 2.5% | 11.47 K$\Omega$ | 14.7% |
| $R_6$ | 10.31 K$\Omega$ | 3.1% | 9.84 K$\Omega$ | 1.6% |
| $R_7$ | 10.47 K$\Omega$ | 4.7% | 9.84 K$\Omega$ | 1.6% |
| $R_8$ | 9.55 K$\Omega$ | 4.5% | 9.84 K$\Omega$ | 1.6% |
| $R_9$ | — | — | 10.16 K$\Omega$ | 1.6% |
| $R_{10}$ | — | — | 10.20 K$\Omega$ | 2.0% |
| $R_{11}$ | — | — | 9.84 K$\Omega$ | 1.6% |
| $R_{12}$ | — | — | 10.18 K$\Omega$ | 1.8% |
| $R_{13}$ | — | — | 10.18 K$\Omega$ | 1.8% |
| $C_1$ | 0.0197 $\mu$F | 1.5% | 0.0001 pF | 99.9% |
| $C_2$ | 0.0191 $\mu$F | 4.5% | 0.0098 $\mu$F | 2.0% |
| $C_3$ | — | — | 0.0089 $\mu$F | 11.0% |
| $C_4$ | — | — | 0.0093 $\mu$F | 7.0% |

The above described method was tested with mixed circuits derived from International Symposium on Circuit and Systems, ISCAS, 1985, benchmark digital circuits C432 and C6288. Digital test vectors were determined with a PODEM algorithm; as described by P. Goel et al. *An Implicit Enumeration Algorithm To Generate Tests For Combinational Logic Circuits*, IEEE Trans. on Computers, C-30(3) :215–222, March 1981 hereby incorporated by reference into this application. Primary inputs 1 through 8 of the digital circuit were connected to the outputs of the analog circuit and the remaining inputs were independent inputs. A test vector of all 1's for the 8 bits from the analog to digital converter determine a 4.92 volt amplitude. The C432 circuit was connected to the biquadratic filter 100 shown in FIG. 10. The digital circuit C432 has 36 inputs, 160 logic gates and 7 outputs. The first 8 inputs were driven by the output of the biquadratic filter coming through an analog to digital converter. The C6288 circuit was connected to the leapfrog circuit 500 shown in FIG. 16. The digital 16-bit parallel multiplier circuit C6288 has 32 inputs, 2416 logic gates and 32 outputs. The first 8 inputs were driven by the,output of the leapfrog analog filter coming through an analog to digital converter representing analog outputs and calculated analog inputs to produce the digital tests.

Figure 18:
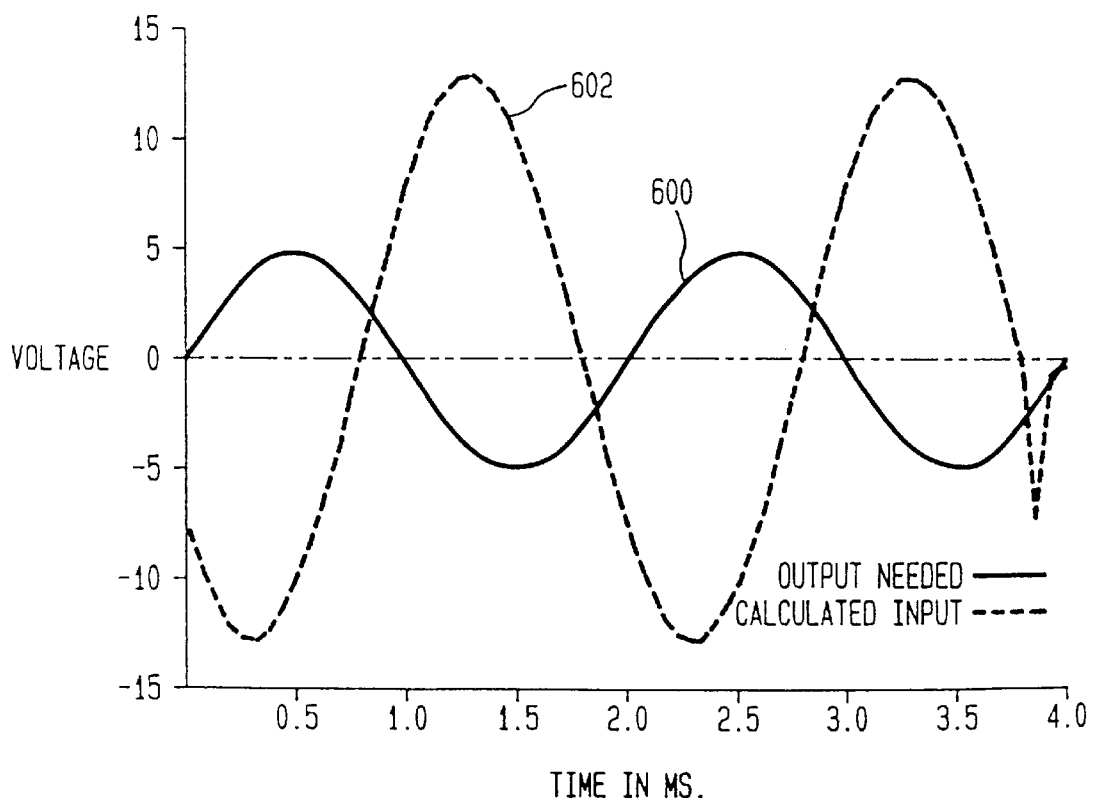
FIG. 18 is a graph of signals used to test the C432 digital benchmark circuit from an analog biquad filter.
Figure 19:
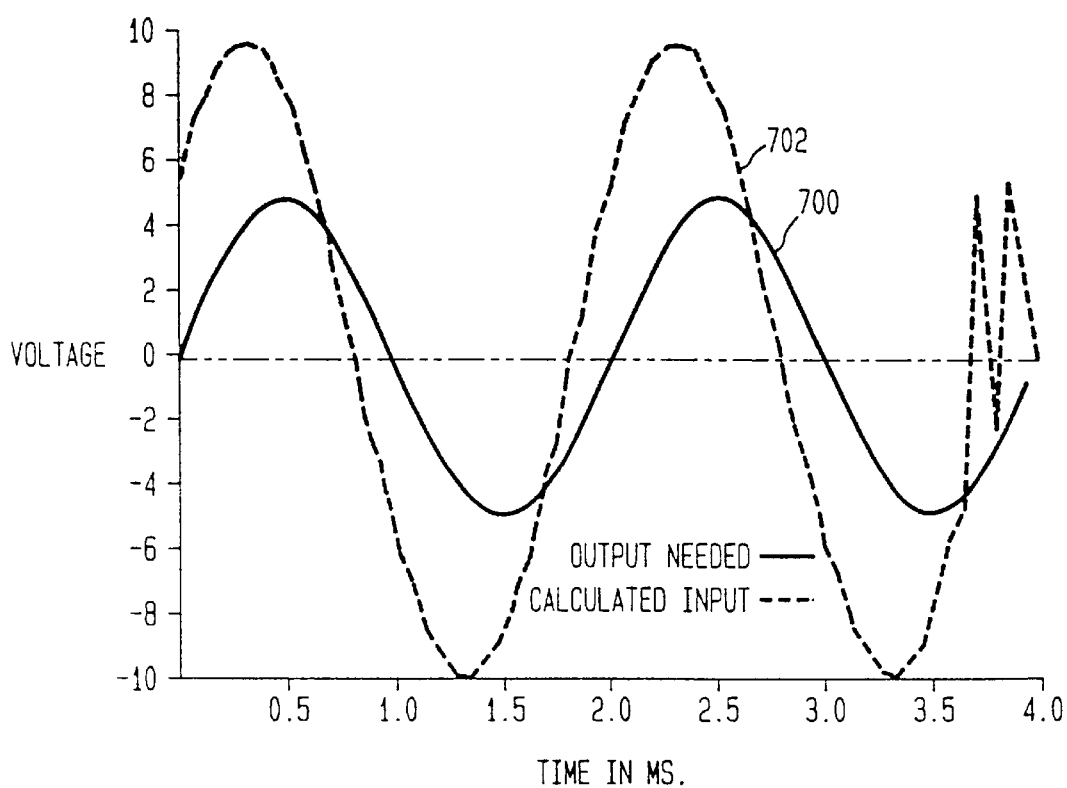
FIG. 19 is a graph of signals used for an analog C6288 digital benchmark circuit from a leapfrog circuit.

FIG. 18 represents a comparison of the output needed 600 and calculated input 602 to produce the digital test for the C432 circuit from the biquadratic analog circuit. FIG. 19 represents a comparison of the output needed 700 and calculated input 702 for the C6288 digital circuit from the leapfrog analog circuit.

In summary, the present invention has the advantage of generating tests for mixed analog and digital circuits which cannot be performed with conventional methods. The method generates a mixture of analog and digital waveforms which are applied to the circuit to be tested. Each set of test signals exposes a set of faults in specific wires, transistors and analog components in the circuit. If a fault is present, one or more outputs of the circuit will change from their expected values. The method defines parametric faults of the analog components. Both analog to digital and digital to analog circuits can be tested. It will be appreciated by those of ordinary skill in the art that modifications may be made without departing from the spirit and scope of the invention.

We claim:

1. A method for testing and for defining faults in components in an analog circuit comprising the steps of:

defining an assumed good output signal value and output tolerance of said good output signal value for the analog circuit;

defining a bad output signal value by subtracting said output tolerance from said good output signal value;

generating a signal flow graph of flow of analog inputs to analog outputs for nodes of the components of the analog circuit;

defining edges between said nodes in said signal flow graph and a symbolic equation expression representing an edge weight for each said edge;

inverting said signal flow graph to describe said analog inputs from said analog outputs;

first reverse analog backtracing said inverted signal flow graph with said good output signal value to determine good node values for each of said nodes in said signal flow graph and good values for said analog inputs, said good values for said analog inputs defining analog input waveforms;

second reverse analog backtracing said inverted signal flow graph with said bad output signal value to determine bad node values for each of said nodes in said flow graph;

defining at least one of the components as a faulty component;

determining a bad edge as said edge represented by said symbolic equation expression which includes a representation of said faulty component;

determining a good edge as said edge represented by said symbolic equation expression which does not include a representation of said faulty component;

determining a component tolerance value for each of said components from said symbolic equation expressions using good node values before each good edge and bad node values after each bad edge, the component tolerance being determined as the change in said faulty component needed to exceed said output tolerance; and applying said analog input waveforms to said circuit to generate second analog output signal values, wherein a fault of one or more of said components of said analog circuit is determined when at least one of said second analog output values is greater than said good output signal value plus or minus said component tolerance value.

2. The method of claim 1 wherein said good output signal value, said bad output signal value and said output tolerance is a voltage.

3. A system for testing and for defining faults in components in an analog circuit comprising:

means for defining an assumed good output signal value and output tolerance of said good output signal value for the analog circuit;

means for defining a bad output signal value by subtracting said output tolerance from said good output signal value;

means for generating a signal flow graph of flow of analog inputs to analog outputs for nodes of the components of the analog circuit;

means for defining edges between said nodes in said signal flow graph and a symbolic equation expression representing an edge weight for each said edge;

means for inverting said signal flow graph to describe said analog inputs from said analog outputs;

means for first reverse analog backtracing said inverted signal flow graph with said good output signal value to determine good node values for each of said nodes in said signal flow graph and good values for said analog inputs, said good values for said analog inputs defining analog input waveforms;

means for second reverse analog backtracing said inverted signal flow graph with said bad output signal value to determine bad node values for each of said nodes in said flow graph;

means for defining at least one of the components as a faulty component;

means for determining a bad edge as said edge represented by said symbolic equation expression which includes a representation of said faulty component;

means for determining a good edge as said edge represented by said symbolic equation expression which does not include a representation of said faulty component;

means for determining a component tolerance value for each of said components from said symbolic equation expressions using good node values before each good edge and bad node values after each bad edge to determine a component value as the change in said faulty component needed to exceed said output tolerance; and means for applying said analog input waveforms to said circuit to generate second analog output signal values, wherein a fault of one or more of said components of said analog circuit is determined when at least one of said second analog output values is greater than said good output signal value plus or minus said component tolerance value.

4. A method for generating test patterns for mixed signal circuits having at least one digital circuit and analog circuit, said digital circuit having digital inputs and digital outputs and said analog circuit having analog inputs and analog outputs comprising the steps of:

determining digital input values of said digital circuit which generate a digital fault of said digital circuit;

determining a good analog output value of said analog circuit from said digital inputs which changes the value of said digital outputs which detects a digital fault and output tolerance of said good analog output values;

defining a bad analog output signal value by subtracting said output tolerance from said good analog output value;

generating a signal flow graph of flow of analog inputs to analog outputs for nodes of the components of the analog circuit;

defining edges between said nodes in said signal flow graph and a symbolic equation expression representing an edge weight for each said edge;

inverting said signal flow graph to describe said analog inputs from said analog outputs;

first reverse analog backtracing said inverted signal flow graph with said good analog output signal value to determine good node values for each of said nodes in said signal flow graph and good values for said analog inputs, said good values for said analog inputs defining analog input waveforms;

second reverse analog backtracing said inverted signal flow graph with said bad analog output signal value to determine bad node values for each of said nodes in said flow graph;

defining at least one of the components as a faulty component;

determining a bad edge as said edge represented by said symbolic equation expression which includes a representation of said faulty component;

determining a good edge as said edge represented by said symbolic equation expression which does not include a representation of said faulty component;

determining a component tolerance value for each of said components from said symbolic equation expressions using good node values before each good edge and bad node values after each bad edge to determine a component value as the change in said fault component needed to exceed said output tolerance; and applying said analog input waveforms to said circuit to generate second analog output signal values, wherein said input waveform and said component tolerance determine deviations in the components of said analog circuit that change said second analog output values.

5. The method of claim 4 wherein said digital inputs are generated with an automatic test generator.

6. The method of claim 4 wherein said analog output value is determined by a voltage measurement V of one of the components and said output tolerance is determined as a change of voltage $\Delta V$.

7. A system for generating analog test patterns for a mixed circuit having a digital part and an analog part in which the input stage having digital inputs and digital outputs and said analog part having analog inputs and an analog output which drives the digital part through a digital to analog converter comprising;

said analog to digital converter positioned between said analog part and said digital part of said mixed circuit;

means for testing said digital inputs of said digital part which generate a digital fault;

means for determining a good analog output value of said analog circuit from said digital inputs which changes the value of said digital outputs to detects a digital fault and output tolerance of said good analog output values;

means for defining a bad analog output signal value by subtracting said output tolerance from said good analog output value;

means for generating a signal flow graph of flow of analog inputs to analog outputs for nodes of the components of the analog circuit;

means for defining edges between said nodes in said signal flow graph and a symbolic equation expression representing an edge weight for each said edge;

means for inverting said signal flow graph to describe said analog inputs from said analog outputs;

means for first reverse analog backtracing said inverted signal flow graph with said good analog output signal value to determine good node values for each of said nodes in said signal flow graph and good values for said analog inputs, said good values for said analog inputs defining analog input waveforms;

means for second reverse analog backtracing said inverted signal flow graph with said bad analog output signal value to determine bad node values for each of said nodes in said flow graph;

means for defining at least one of the components as a faulty component;

means for determining a bad edge as said edge represented by said symbolic equation expression which includes a representation of said faulty component;

means for determining a good edge as said edge represented by said symbolic equation expression which does not include a representation of said faulty component;

means for determining a component tolerance value for each of said components from said symbolic equation expressions using good node values before each good edge and bad node values after each bad edge to determine a component value as the change in said fault component needed to exceed said output tolerance; and means for applying said analog input waveforms to said circuit to generate second analog output signal values, wherein a test pattern is determined from a value of said analog outputs which changes said digital outputs.

8. The apparatus of claim 7 wherein said analog output is determined by a voltage V of one of said components and said analog to digital converter determines a voltage tolerance $\Delta V$ of the analog circuit output, wherein said voltage V and said voltage tolerance $\Delta V$ are backtraced in said circuit.

9. The apparatus of claim 8 wherein said analog output is a smooth regular waveform.

10. The apparatus of claim 9 wherein said means for testing said digital inputs is an automatic test generator.

11. An apparatus for generating digital and analog test patterns for a mixed circuit which has a digital part and an analog part in which the input stage is a digital circuit for driving the analog part through a digital-to-analog converter comprising:

means for determining digital input values to detect a digital fault;

means for determining an analog input signal from a digital output;

generating a signal flow graph of analog inputs to analog outputs of the analog circuit; and inverting said signal flow graph to describe said analog inputs from said analog outputs;

means for determining analog component parametric variations for said analog circuit by backtracing said inverted signal flowgraph with said analog input signal; and means for determining an analog input test pattern from said analog component parametric variations.

12. The apparatus of claim 11 wherein said means for determining said analog input test pattern backtraces an output analog voltage measurement V and output voltage tolerance $\Delta V$.

13. The apparatus of claim 12 wherein said means for determining digital input values is an automatic test generator.

* * * * *